United States Patent [19]

Kagami

[11] Patent Number: 5,629,944
[45] Date of Patent: May 13, 1997

[54] TEST MODE SETTING CIRCUIT OF TEST CIRCUIT FOR SEMICONDUCTOR MEMORY

[75] Inventor: Akihiko Kagami, Tokyo, Japan

[73] Assignee: NEC Corporation, Tokyo, Japan

[21] Appl. No.: 670,823

[22] Filed: Jun. 25, 1996

[30] Foreign Application Priority Data

Jun. 30, 1995 [JP] Japan ..................... 7-166253

[51] Int. Cl.$^6$ ................................... G01R 31/28
[52] U.S. Cl. .............................. 371/21.4; 371/28
[58] Field of Search ........................... 371/22.1, 21.4, 371/25.1, 28; 365/201, 185.22; 324/73.1

[56] References Cited

U.S. PATENT DOCUMENTS

| | | | |
|---|---|---|---|
| 5,469,444 | 11/1995 | Endoh et al. | 371/21.4 |
| 5,521,868 | 5/1996 | Nobukata | 371/21.4 |
| 5,544,175 | 8/1996 | Posse | 371/21.4 |

FOREIGN PATENT DOCUMENTS 3-14238  6/1991  Japan .

*Primary Examiner*—Vincent P. Canney
*Attorney, Agent, or Firm*—Sughrue, Mion, Zinn, Macpeak & Seas

[57] ABSTRACT

A test mode setting circuit includes a high voltage detection circuit, an uppermost row address buffer and a row address buffer control circuit for the uppermost row address buffer. When a high voltage is supplied to a common input terminal for the test mode setting, the uppermost row address buffer receives through the common input terminal an uppermost address signal, and provides the uppermost address signal as an uppermost internal row address signal. The row address buffer control circuit operates such that, when an upper stage transistor in stacked two N-channel MOS transistors of the uppermost row address buffer becomes conductive through the high voltage, an internal control signal for the uppermost row address buffer is supplied to a lower stage transistor connected to a ground thus causing the lower stage transistor to become a non-conductive state whereby a voltage across the gate and source electrodes and a voltage across the gate and drain electrodes of the upper stage transistor are rendered to be a level lower than the high voltage. This enables the relaxing of the high electric field applied to the gate electrode and the reducing of the likelihood of the destruction of the gate oxide film.

3 Claims, 6 Drawing Sheets

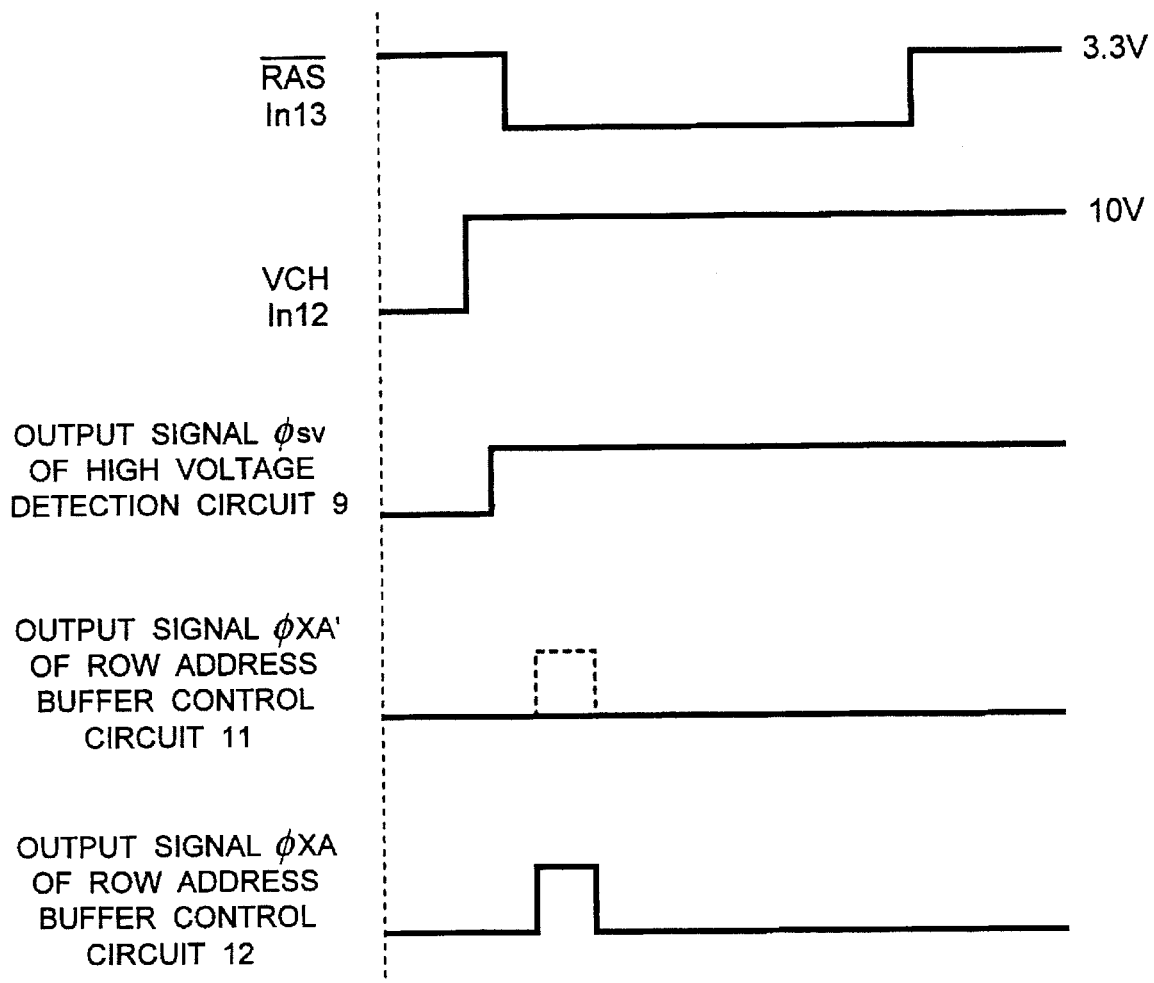

TEST MODE SETTING CIRCUIT OF TEST CIRCUIT FOR SEMICONDUCTOR MEMORY

BACKGROUND OF THE INVENTION

(1) Field of the Invention

The present invention relates to a test mode setting circuit for a semiconductor device, and more particularly to a test mode setting circuit for a test circuit in a semiconductor memory in which a change to a test mode is made using a high voltage detection circuit.

(2) Description of the Related Art

The advancement in a fine processing technology for semiconductor elements has made it possible to produce a semiconductor memory device with an increased capacity. In a typical DRAM as an example, the degree of integration has advanced four times in every three recent years. The application of such a device is increasingly expanded in fields such as information, communication, sound and image processing, and the advanced technology is contributing to the enhancement of the device performance and the miniaturization of the device as well as the decrease in power consumption.

However, the increase in the memory capacity has resulted in increasing the time required for conducting tests of the semiconductor memory circuits, and this has become one of the causes for hindering the productivity in the manufacturing of semiconductor devices equipped with memory circuits.

For this reason, the circuit for testing a memory circuit has been proposed in various ways. FIG. 1 is a block diagram of the overall structure of a semiconductor memory equipped with a test mode setting circuit of the kind proposed, and FIG. 2 is a block diagram showing the main portion of the test mode setting circuit. The circuit shown comprises a clock generator 1b, lower row address buffers 2a–21, an uppermost row address buffer 2m, a row decoder 3, a memory cell array 4, a sense amplifier 5, a column address buffer 6, a column decoder 7, a data output buffer 8, a high voltage detection circuit 9, and a data input buffer 10. The clock generator 1b produces predetermined internal clock signals in response to inverted RAS (Row Address Strobe) signals, inverted CAS (Column Address Strobe) signals, inverted WE (Write Enable) signals and inverted OE (Output Enable) signals which are synchronized with clocks. The row address buffers 2a–21 receive, from the outside, signals A0–A11 among the multiplexed address signals A0–A12, and distribute them as internal row address signals φA0–φA11. The row address buffer 2m provides an internal row address signals φA12 from the signal A12, and receives a high voltage of, for example, 10 V, for the test mode setting. The row decoder 3 carries out decoding by using the row address signals φA0–φA12 such that, in the case of, for example, a 64 Mbit DRAM, one of $2^{13}$ of word lines is designated. The memory cell array 4 contains, for example, $64 \times 10^6$ memory cells designated by the row decoder. The sense amplifier 5 amplifies a minute voltage of data read out from the memory cell array. The column address buffer 6 receives the address signals A0–A10 and distributes them as internal column address signals Y0–Y10. The column decoder 7 carries out decoding by using the column address signals Y0–Y10 such that, in the case of the 64 Mbit DRAM, one each of $2^{11}$ of column lines is designated. The data output buffer 8 outputs to the outside the output data of the sense amplifier 5. The high voltage detection circuit 9 outputs a logical high level voltage when a voltage difference between the high voltage supplied from the outside through the common input terminal for the test mode setting and the power source voltage VCC becomes larger than a predetermined voltage. The data input buffer 10 supplies to the sense amplifier an external data received from the input/output terminals I/O1–I/O4.

The clock generator 1b has a row address control circuit 13 whose output signal is the internal clock signal φXA. The row address (X12) buffer 2m outputs through an in-phase buffer 21 an output of a NAND circuit. This NAND circuit is constituted by P-channel MOS transistors P1 and P2 having their sources connected to the power source potential line VCC and drains connected with each other with a node being formed, and N-channel MOS transistors N1 and N2 connected in series between the node and the ground. A drain electrode of the transistor N1 is an output node, and gate electrodes of the transistors P1 and N2 receive the address signal A12 though the input terminal In12 while gate electrodes of the transistors P2 and N1 receive the signal φXA.

The high voltage detection circuit 9 has its input node connected to a common input terminal to which an input node of the row address buffer 2m is commonly connected, and its output node connected to an input node for the signal φsv of the clock generator 1b.

Now, reference is made to FIGS. 1 and 2, as well as FIG. 3 which is a timing chart for use in explaining the operation of the circuit according to the invention. Under the normal operation state, assuming that the power source voltage VCC is 3.3 V, the pulse whose amplitude is about 2.0 V with the mean amplitude being about 1.5 V is supplied to the input terminals In13–In16 which respectively receive the clock synchronization inversion RAS signal, inversion CAS signal, inversion WE signal and inversion OE signal, to the input terminals In0–In12 which receive the address signals A0–A12, and to the input/output (I/O) terminal for inputting and outputting data.

During the reading operation, each of the clock synchronization inversion RAS signal, inversion CAS signal, and inversion OE signal is made a logical low level, thus causing the clock generator 1b to be in an active state.

By the row address (X0–X12) buffers 2a–2m which receive the address signals A0–A12 and the row decoder 3, the word line of a desired memory cell in the memory cell array is selected, and the data read on the data line through the selected memory cell is amplified by the sense amplifying section 5.

On the other hand, by the column address (Y0–Y10) buffer 6 which distributes column addresses Y0–Y10 and the column decoder 7, a desired sense amplifier in the sense amplifying section 5 is selected, and the output data from the selected sense amplifier is amplified at the data output buffer 8 and outputted to the external input/output terminals I/O1–I/O4.

At this time, the state is under a normal operation, and the output signal φsv of the high voltage detection circuit 9 is remaining as a low level, so that the test mode state is in an inactive state.

The high voltage detection circuit 9 is arranged such that the output signal φsv thereof becomes a high level when the voltage difference between the power source voltage VCC and the voltage supplied to the input terminal In12 becomes higher than a predetermined voltage. Thus, when the mode is changed to a test mode, the input terminal In12 is pulled-up to the high voltage and, by the inversion of the output signal φsv of the high voltage detection circuit 9 to a high level, the clock generator 1b to which the φsv is supplied turns to an active state in the test mode. That is, the input terminal In12 serves as a common terminal to which the address signal A12 or the high voltage is supplied.

The clock generator 1b having turned to the active state is now in the test mode so that, when the internal control signal is inputted, the row decoder 3, the column address buffer 6 and the data output buffer 8 as well as the data input buffer 10 are controlled so as to carry out the operation of, for example, multi-bit simultaneous writing and reading.

Another prior art example of the test mode setting circuit equipped with an input circuit is disclosed in Japanese Patent Application Kokai Publication No. Hei 3-142387. The input circuit is disclosed therein in a block diagram without showing a detailed circuit configuration. However, it is general that such a circuit is constituted by a NAND circuit as explained above. This prior art example is shown by a circuit diagram in FIG. 4. As shown in therein, the test mode setting circuit has an input terminal In21 which is common to an input circuit 31 and a high voltage detection circuit 33. When the high voltage is supplied to the input terminal In21, the output level of the high voltage detection circuit 33 is inverted with the mode changing to a test mode, and an input circuit 31 becomes inactive. The test instruction data received from the input terminal In22 is supplied to a latch circuit 34 through an input circuit 32. This latch circuit 34 takes-in data at the inverted output level of the high voltage detection circuit 33 and, when the inverted output level restores to the original level, the data is latched and supplied to the test circuit 35, allowing the test to be carried out. This arrangement, therefore, prevents the occurrence of such a problem that has occurred in the above explained prior art example wherein, if the high voltage is lowered for any reason during the testing, the mode changes to a non-test mode.

In the first prior art input circuit explained above, when the mode is changed to a test mode, the input terminal In12 which is a common terminal for supplying the address signal A12 and the high voltage is pulled-up to the high voltage and, by inverting the output signal φsv of the high voltage detection circuit 9 to a high level, the clock generator 1 to which the signal φsv is supplied is changed to an active state of the test mode.

Specifically, among the P-channel MOS transistors P1 and P2 and the N-channel MOS transistors N1 and N2 that constitute a 2-input NAND circuit in the row address (X12) buffer 2m, the P-channel MOS transistor P1 and the N-channel MOS transistor N2 at the ground potential side have their gate electrodes connected to the input terminal In12. Therefore, under the test mode, the high voltage supplied to the input terminal In12 is directly applied to the gate electrodes of these P-channel MOS transistor P1 and the N-channel MOS transistor N2 at the ground potential side.

Especially, since the N-channel MOS transistor N2 has its source electrode connected to the ground, the voltage across the gate electrode and the source electrode and across the gate electrode and the drain electrode is in the state in which the same electric field as that of the high voltage is applied.

FIG. 5 is a diagram showing the structure of the prior art transistor described above. In this structure, when the voltage across the source electrode 44 and the gate electrode 42 made of polysilicon formed over the P-Si substrate 41 becomes high, the thin gate oxide film 47 having a thickness of about 10 nm is destroyed so that the transistor N2 having a channel 45 formed between the source electrode 44 under the gate region and the diffusion layer 46 of the drain electrode 43 no longer performs amplifying function.

Also, in the input circuit disclosed in Japanese Patent Application Kokai Publication No. Hei 3-142387, which, although illustrated only in a block diagram as shown in FIG. 4, is understood from the general knowledge as being in a NAND circuit form so that the same problem caused by the destruction resulting in the non-performance of the amplifying function occurs as explained above.

SUMMARY OF THE INVENTION

An object of the invention, therefore, is to overcome the problems existing in the prior art and to provide a test mode setting circuit which is used when an internal circuit of a semiconductor integrated circuit equipped with a memory circuit is set to a test mode and in which, when a high voltage is supplied to a specified input terminal and a high voltage detection circuit inverts an output level thereof in response to the supplied voltage for the test mode setting, a gate oxide film of a first stage transistor for a specified input circuit connected to the specified input terminal is prevented from being destroyed despite the supplied high voltage.

According to one aspect of the invention, there is provided a test mode setting circuit comprising:

a clock generator which generates predetermined internal control signals in response to an inverted RAS signal, inverted CAS signal, inverted WE signal and inverted OE signal which are synchronized with clock signals;

a plurality of row address buffers which receive address signals other than an uppermost address signal among multiplexed address signals externally supplied, and distribute the received address signals as internal row address signals;

a high voltage detection circuit which receives a high voltage higher than a power source voltage or a voltage of the uppermost address signal through a common input terminal, and which outputs a test mode setting signal when a voltage difference between the voltage received and the power source voltage becomes higher than a predetermined voltage; and an uppermost row address buffer which receives through the common input terminal the high voltage or the uppermost address signal among the multiplexed address signals, and provides the uppermost address signal as an uppermost internal row address signal; and a voltage supplying means which operates such that, when, on receiving the high voltage through the common input terminal for setting a test mode, an upper stage transistor of two N-channel MOS transistors stacked one on the other in the uppermost row address buffer for the uppermost address signal becomes conductive through the high voltage, an uppermost internal control signal for the uppermost row address buffer among the internal control signals is supplied to a lower stage transistor connected to a ground thus causing the lower stage transistor to become a non-conductive state whereby a voltage across a gate electrode and a source electrode and a voltage across the gate electrode and a drain electrode of the upper stage transistor are rendered to be a level lower than the high voltage.

The test mode setting circuit according to the invention is equipped with the voltage supplying means and includes the high voltage detection circuit, the uppermost row address buffer, and the plurality of lower row address buffers. The input node of the high voltage detection circuit is connected to the common input terminal of the uppermost row address buffer. The uppermost row address buffer receives the uppermost address signal. The lower row address buffers receive the lower address signals. For the test mode setting, the high voltage is supplied to the common input terminal and, when the upper stage one of the stacked N-channel MOS transistors which is for the particular row address buffer, among the plurality of row address buffers, for the uppermost address signal, becomes conductive by the high level voltage, the internal control signal is supplied to the lower stage one of the N-channel MOS transistors whereby this lower stage N-channel MOS transistor becomes non-conductive and, as a result, the voltage across the gate and source and the voltage across the gate and drain of the upper stage one of the N-channel MOS transistors are made lower than the high voltage. This enables the relaxing of the high electric field applied to the gate electrode and the reducing of the likelihood of the destruction of the gate oxide film.

BRIEF DESCRIPTION OF THE DRAWINGS

The above and other objects, features and advantages of the present invention will be apparent from the following description of preferred embodiments of the invention explained with reference to the accompanying drawings, in which:

FIG. 7 is a timing chart for use in explaining the performance of the circuit of the embodiment according to the invention.

PREFERRED EMBODIMENT OF THE INVENTION

Now, a preferred embodiment of the invention is explained with reference to the drawings.

Figure 1:
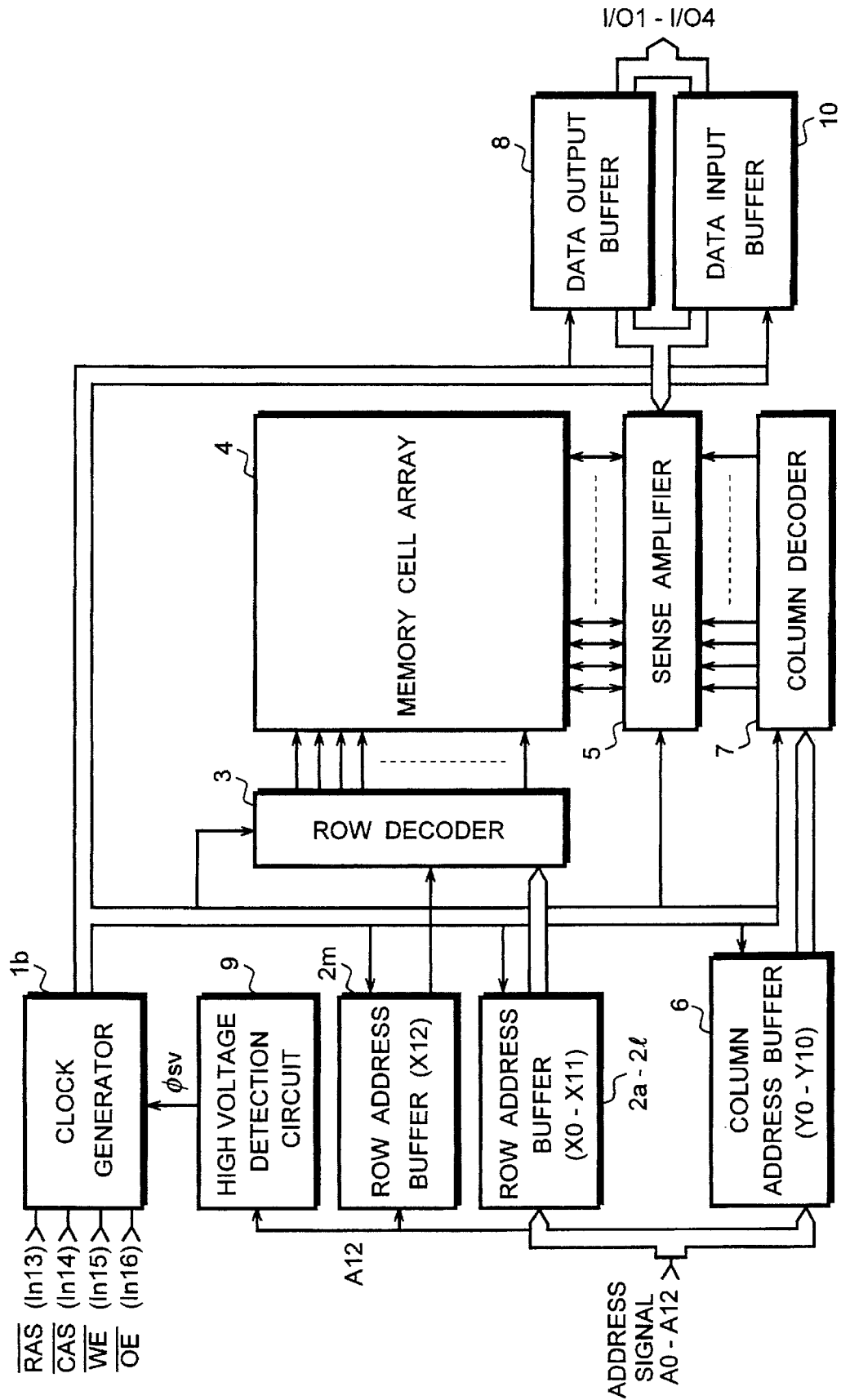
FIG. 1 is a block diagram showing the overall structure of a conventional semiconductor memory.
Figure 2:
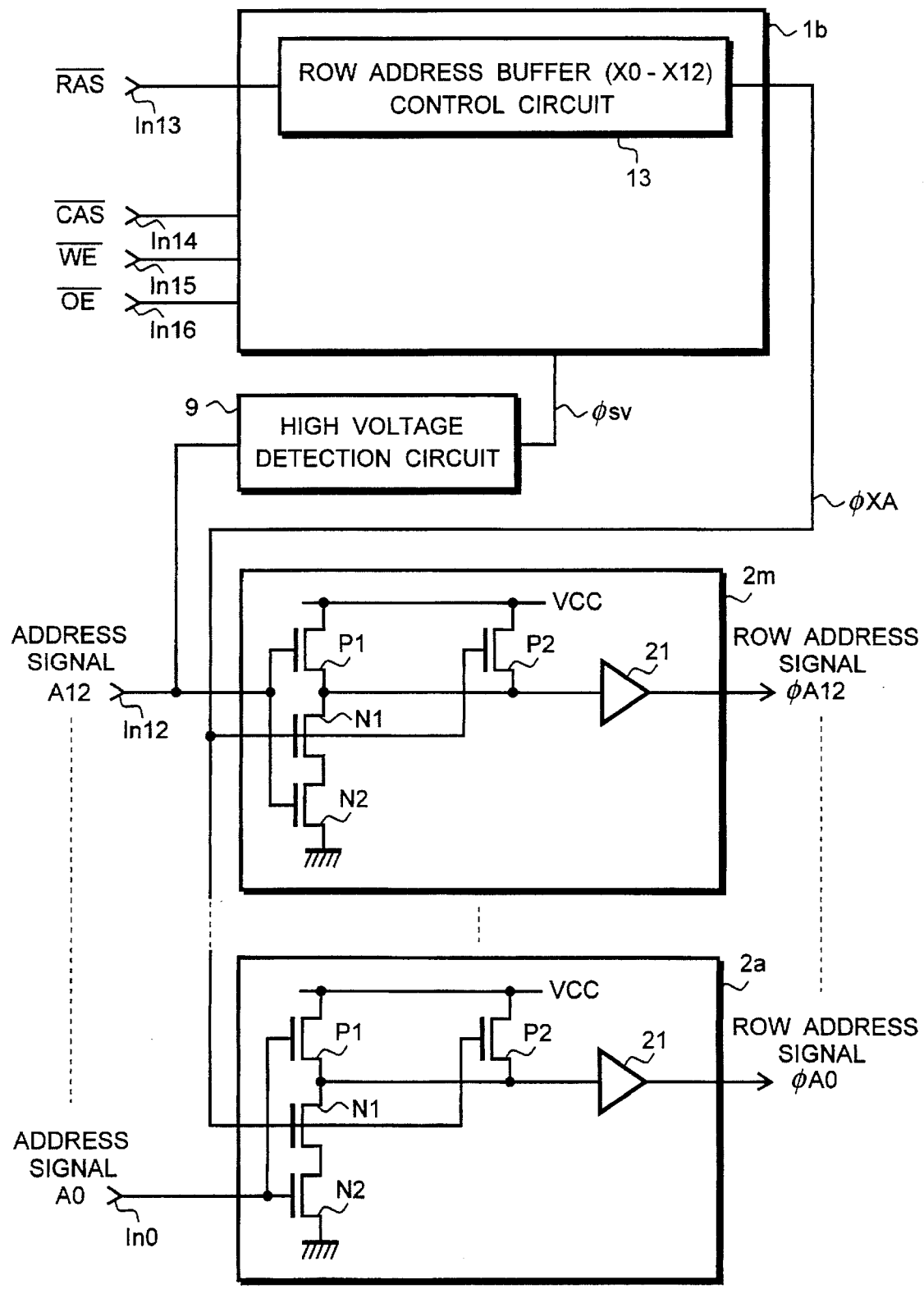
FIG. 2 is a block diagram showing an example of a test mode setting circuit in a conventional semiconductor memory.
Figure 3:
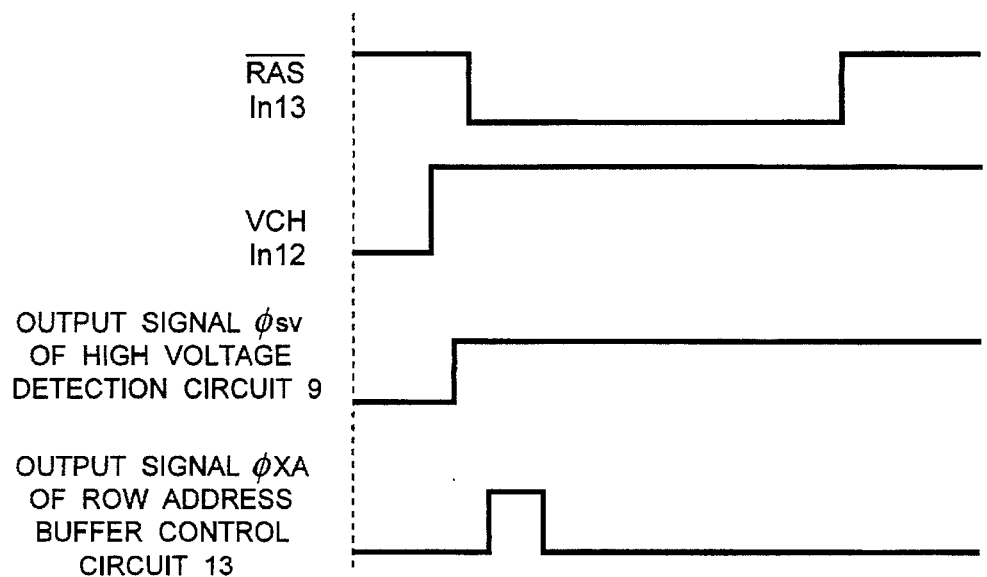
FIG. 3 is a timing chart for use in explaining the performance of a circuit of the prior art example.
Figure 4:
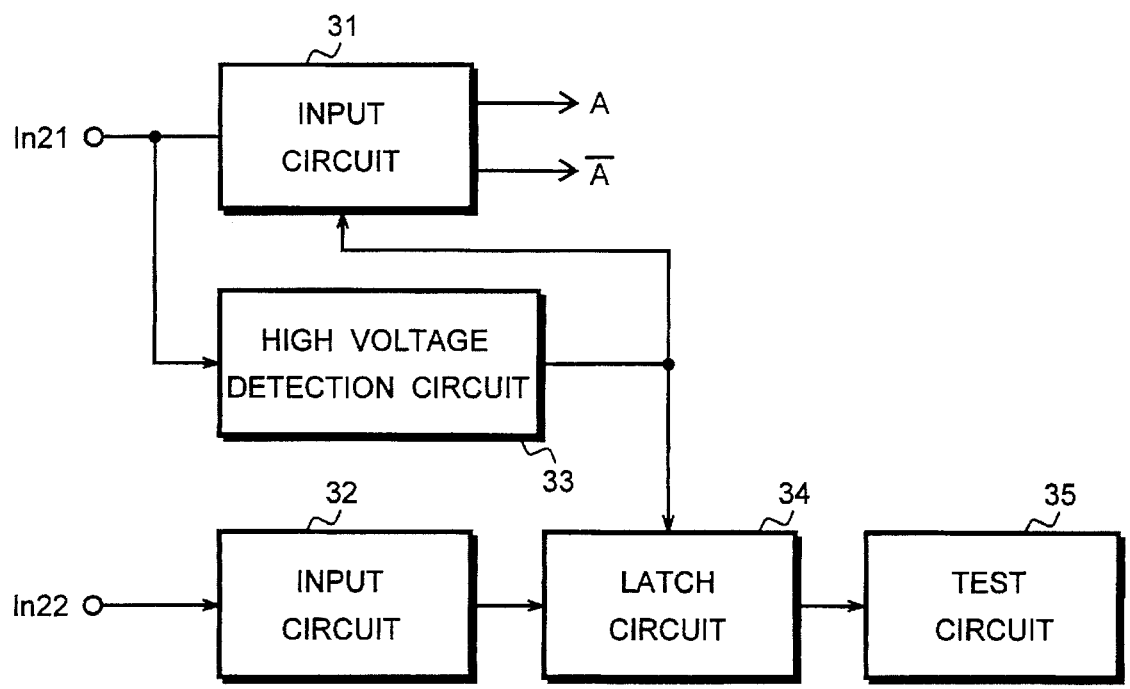
FIG. 4 is a block diagram showing another example of a test mode setting circuit in a conventional semiconductor memory.
Figure 5:
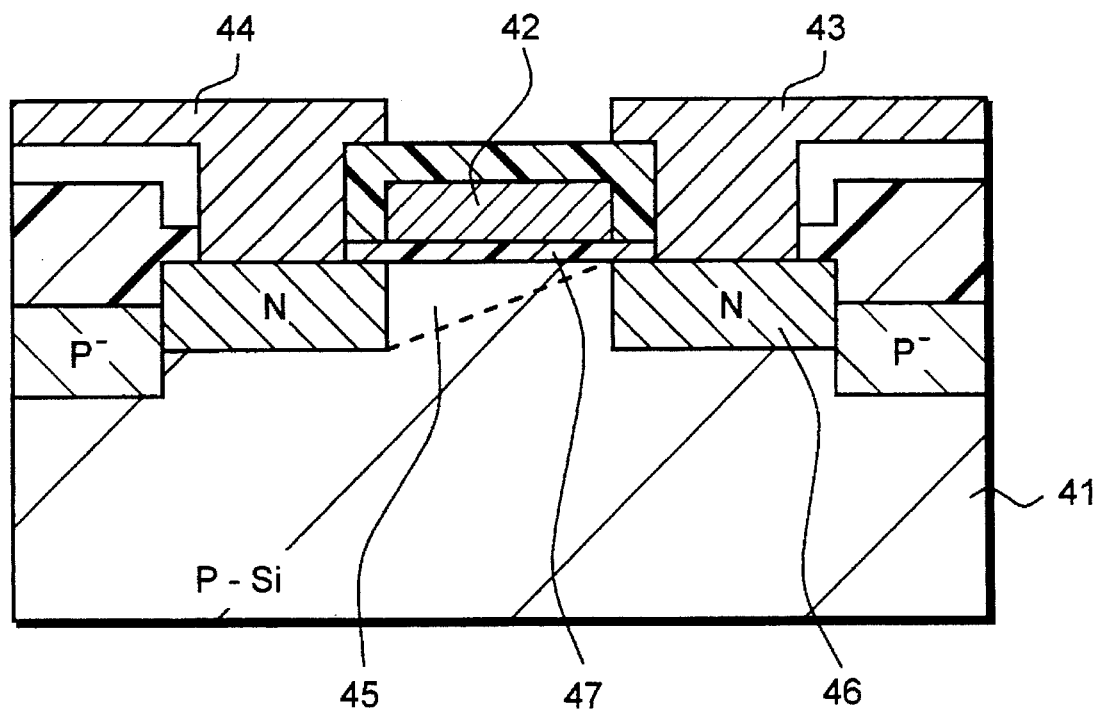
FIG. 5 is a diagram showing a structure of a prior art transistor for use in explaining the destruction of a gate oxide film by a high voltage.
Figure 6:
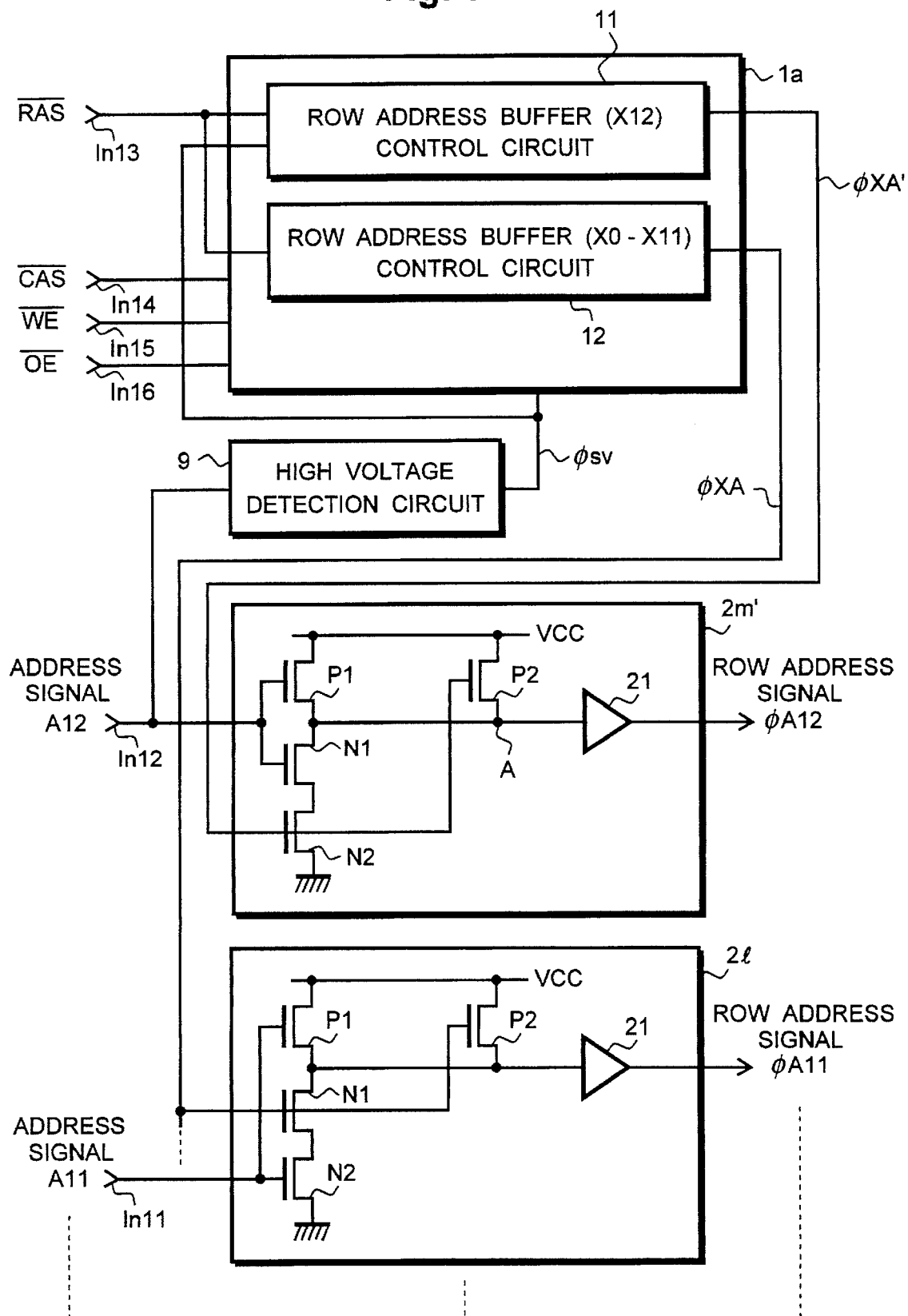
FIG. 6 is a block diagram showing a main portion of a test mode setting circuit of an embodiment according to the invention.

FIG. 6 shows, in a block diagram, the main portion of the test mode setting circuit according to the invention. As shown therein, the circuit comprises a high voltage detection circuit 9, a row address (X12) buffer control circuit 11 for controlling an uppermost row address buffer X12, a row address (X0–X11) buffer control circuit 12 for controlling row address buffers X0–X11, a clock generator 1a, a plurality of row address buffers 2a–21 (In FIG. 6, only the row address buffer 21 is shown), and an uppermost row address buffer 2m'. The high voltage detection circuit 9 outputs a test mode setting signal φsv which is inverted from a low level to a high level when the voltage difference between the address signal A12 which is supplied from the outside and the power source voltage VCC becomes higher than a predetermined voltage. The row address buffer (X12) control circuit 11 generates an internal control clock signal φXA' upon receiving an inverted RAS signal, and makes the signal φXA' a low level when the test mode setting signal φsv supplied from the high voltage detection circuit 9 during the test mode operation becomes a high level. The row address (X0–X11) buffer control circuit 12 generates and outputs the internal control clock φXA both during the normal operation and the test mode operation. The clock generator 1a receives the inverted CAS signal, inverted WE signal and inverted OE signal, and generates respectively predetermined internal control clocks. The row address buffers 2a–21 receive, from the outside, address signals A0–A11 among the multiplexed address signals A0–A12 and distributes them as internal row address signals φA0–φA11. The uppermost row address buffer 2m' outputs through an in-phase buffer 21 the internal control clock signal φA12 generated by a logical product of the address signal A12 and the internal control clock signal φXA' and receives a high voltage VCH for the test mode setting.

The row address (X12) buffer 2m' outputs an output of a NAND circuit through the in-phase buffer 21. The NAND circuit is constituted by P-channel MOS transistors (P1, P2) having source electrodes connectred to a power source potential line VCC and drain electrodes interconnected thereby forming a node A, and N-channel MOS transistors (N1, N2) connected in series between the node A and a ground. The N-channel MOS transistor N1 has a drain electrode used as an output node, and the address signal A12 is supplied to the gate electrodes of the transistors P1 and N1, and the φXA' is supplied to the gate electrodes of the transistors P2 and N2.

The row address buffer 21 is structurally the same as the uppermost row address buffer 2m', but the address signals A0–A11 are supplied to the transistors P1 and N2 and the control signal φXA is supplied to the transistors P2 and N1.

Now, the operation of the circuit is explained with reference to a circuit diagram of FIG. 6, and a timing chart of FIG. 7.

During the test mode operation, a high voltage VCH is supplied to the input terminal In12 and, when the high voltage detection circuit 9 detects that the potential difference with respect to the power source voltage VCC has exceeded a predetermined voltage, the output of the test mode setting signal φsv of the high voltage detection circuit 9 is inverted from a low level to a high level.

When the initial state is changed to the test mode in response to the signal φsv that has turned to the high level, the output signal φXA' of the row address buffer control circuit 11 is at the low level and this is maintained as it is. When the normal operation state changes to the test mode and the output signal φXA' is the high level, the signal φXA' is outputted after being inverted to the low level. Therefore, in either of these two states, the output signal φXA' becomes the low level at the point when the mode is changed to the test mode.

The output signal φXA' having thus turned to the low level is supplied to the gate electrode of the transistor N2 at the ground potential side of the NAND circuit of the uppermost row address buffer 2m', and the transistor N2 becomes non-conductive and the transistor P2 at the ground potential side becomes conductive. As a result, the output node A is pulled-up to the power source potential which is of the high level and the signal φA12 is outputted through the in-phase buffer 21.

Where, for example, the power source voltage VCC is 3.3 V and the high voltage VCH supplied to the input terminal In12 is 10 V and, when the transistor N2 at the ground potential side becomes non-conductive by the signal φXA', the voltage across the gate and source electrodes and the voltage across the gate and drain electrodes of the transistor N1 which receives the high voltage VCH of 10 V both become 6.7 V which is a voltage difference between the power source voltage VCC and the high voltage (that is, 10 V–3.3 V=6.7 V). Likewise, the voltage across the gate and source electrodes and the voltage across gate and drain electrodes of the transistor P1 both become 6.7 V.

Therefore, under no circumstance is there a situation wherein the high voltage VCH is applied as it is to the gate and source electrodes of the transistor P1, and this means that, unlike in the prior art as explained above, the likelihood of the gate oxide film being destroyed is small.

The uppermost row address (X12) buffer 2m' in the embodiment according to the invention and the uppermost row address (X12) buffer 2m in the prior art example are the same in the point that the first stage in both the cases is constituted by the NAND circuit. However, in the embodiment according to the invention, the row address (X12) buffer control circuit 11 which corresponds to only the address signal A12 is separated from the row address (X0–X11) buffer control circuits 12 corresponding to remaining address signals A0–A11 whereby the output signal φXA' of the row address (X12) buffer control circuit 11 is supplied to the stacked transistor N2 of the NAND circuit. This arrangement is different from the uppermost row address buffer 2m in the prior art example in which the output signal φXA of the row address (X0–X12) buffer control circuit 13 is supplied to the underlying transistor N1.

The level of the signal supplied to the address signal input terminal In12 is in a range of about 2.5 V–0.5 V which is an intermediate level when compared with the power source voltage VCC of 3 V. In the prior art example, the transistor which receives the supply of the signal is the transistor N2 at the ground potential side from between the transistors N1 and N2 stacked one on the other. The transistor N2 can be made small in size so that this configuration is adopted in the row address (X0–X11) buffers 2a–2l in the embodiment according to the invention.

In the embodiment according to the invention, at the row address buffers other than the uppermost row address buffer 2m', that is, the row address buffers 2a–2l for the address signals A0–A11, the output signal φXA of the row address buffer control circuit 12 is supplied to the transistor P2 and the transistor N1, and the address signals A0–A11 are supplied to the transistors P1 and N2 as in the prior art example.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A test mode setting circuit comprising:

a clock generator which generates predetermined internal control signals in response to an inverted RAS signal, inverted CAS signal, inverted WE signal and inverted OE signal which are synchronized with clock signals;

a plurality of row address buffers which receive address signals other than an uppermost address signal among multiplexed address signals externally supplied, and distribute the received address signals as internal row address signals;

a high voltage detection circuit which receives a high voltage higher than a power source voltage or a voltage of said uppermost address signal through a common input terminal, and which outputs a test mode setting signal when a voltage difference between the voltage received and said power source voltage becomes higher than a predetermined voltage;

an uppermost row address buffer which receives through said common input terminal said high voltage or said uppermost address signal among said multiplexed address signals, and provides said uppermost address signal as an uppermost internal row address signal; and a voltage supplying means which operates such that, when, on receiving said high voltage through said common input terminal for setting a test mode, an upper stage transistor of two N-channel MOS transistors stacked one on the other in the uppermost row address buffer for said uppermost address signal becomes conductive through said high voltage, an uppermost internal control signal for said uppermost row address buffer among said internal control signals is supplied to a lower stage transistor connected to a ground thus causing said lower stage transistor to become a non-conductive state whereby a voltage across a gate electrode and a source electrode and a voltage across the gate electrode and a drain electrode of said upper stage transistor are rendered to be a level lower than said high voltage.

2. A test mode setting circuit according to claim 1, in which said voltage supplying means being such that, under a normal operation state, said internal control signal turns to a high level in response to an active state of said inverted RAS signal and, under a test mode state, only said uppermost internal control signal supplied to said uppermost row address buffer for said uppermost address signal turns to a low level in response to a high level signal from said high voltage detection circuit.

3. A test mode setting circuit according to claim 1, in which said voltage supplying means comprises:

a first row address buffer control circuit which produces a first row address buffer control signal upon receiving said inverted RAS signal, and changes said first row address buffer control signal to a low level in response to a high level of said test mode setting signal during the test mode operation, and a second row address buffer control circuit which, both during the normal operation and the test mode operation, produces and outputs a second row address buffer control signal, said uppermost row address buffer being constituted by first and second P-channel MOS transistors having source electrodes connected to a power source potential line and drain electrodes interconnected thereby forming a node, and first and second N-channel MOS transistors connected in series between said node and said ground, said first N-channel MOS transistor having a drain electrode connected to an output buffer, only said uppermost row address buffer for said uppermost address signal being supplied during the normal operation and said high voltage being supplied during the test mode operation to gate electrodes of said first P-channel MOS transistor and said first N-channel MOS transistor through said common input terminal, and said first row address buffer control signal being supplied to the gate electrodes of said second P-channel MOS transistor and said second N-channel MOS transistor.

* * * * *